(12) United States Patent
Chen

(10) Patent No.: US 7,042,689 B2
(45) Date of Patent: May 9, 2006

(54) HIGH VOLTAGE TOLERANT ESD DESIGN FOR ANALOG AND RF APPLICATIONS IN DEEP SUBMICRON CMOS TECHNOLOGIES

(75) Inventor: Chung-Hui Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 17 days.

(21) Appl. No.: 10/348,388

(22) Filed: Jan. 21, 2003

(65) Prior Publication Data

US 2004/0142527 A1    Jul. 22, 2004

(51) Int. Cl.
*H02H 9/00* (2006.01)
(52) U.S. Cl. ...................................................... 361/56
(58) Field of Classification Search .................. 361/56, 361/58, 111, 118, 91.1
See application file for complete search history.

(56) References Cited

U.S. PATENT DOCUMENTS

| | | | |
|---|---|---|---|
| 5,477,414 A | 12/1995 | Li et al. ........................ | 361/56 |
| 6,008,970 A | 12/1999 | Maloney et al. ............... | 361/56 |
| 6,060,752 A | 5/2000 | Williams ...................... | 257/355 |
| 6,284,616 B1 | 9/2001 | Smith .......................... | 438/364 |

OTHER PUBLICATIONS

Richier et al., Investigation of Different ESD Protection Strategies Devoted to 3.3 V RF Applications (2 Ghz) in a 0.18μm CMOS.
Process," EOS/ESD Symposium 2000, pp. 251-259. Leroux et al., " A 0.8-dB NF ESD-Protected 9-mW CMOS LNA. Operating at 1.23 GHz, Proceedings of the 2001 ISSC pp. 760-765.
Ming-Dou Ker et al., ESD Protection Design on Analog Pin with Very Low Input Capacitance for High-Frequency of. Current Made Applications, IEEE Journal of Solid-State Circuits, vol. 35, Issue 8, Aug. 2000, pp. 1194-1199.
Ming-Dou Ker et al., "Dynamic-Floating-Gate Design for Output ESD Protection in a 0.35-μm CMOS Cell Library", Proc. of 1998 ISCAS, vol. 2, 1998, pp. 216-219.

*Primary Examiner*—Stephen W. Jackson

(57) ABSTRACT

The invention describes structures and a process for providing ESD semiconductor protection with reduced input capacitance that has special advantages for high frequency analog pin I/O applications. The structures consist of a first and second NMOS serial pair whose capacitance is shielded from the I/O pins by a serial diode. The first serial pair provides an ESD voltage clamp between the I/O pin and the Vcc voltage source. The second pair provides an ESD voltage clamp between the I/O pin and Vss, or ground voltage source. A NMOS device whose gate is dynamically coupled to the ESD energy through capacitance and a RC network enhances the triggering of both pairs. The serial pairs can be used separately to match specific application requirements or used together.

32 Claims, 5 Drawing Sheets

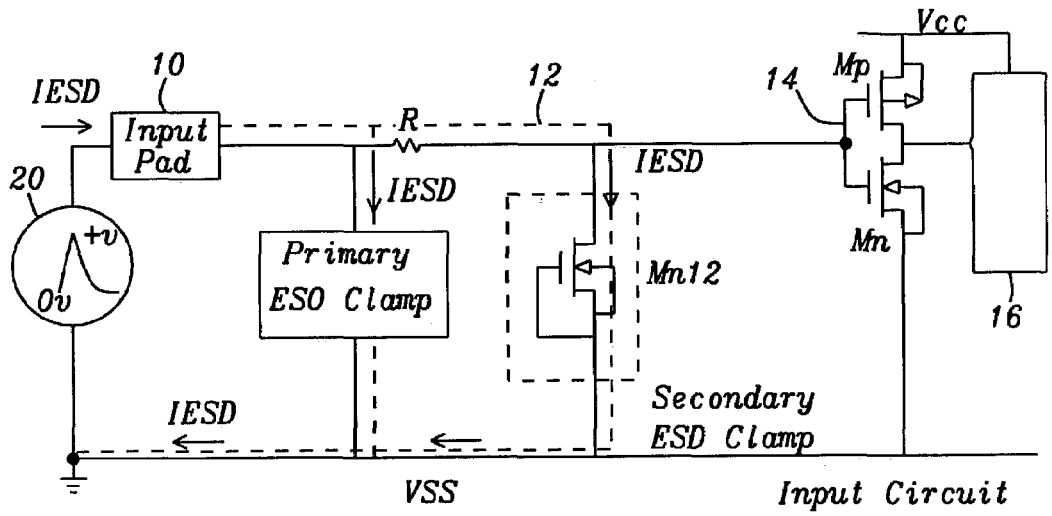
FIG. 1 – Prior Art
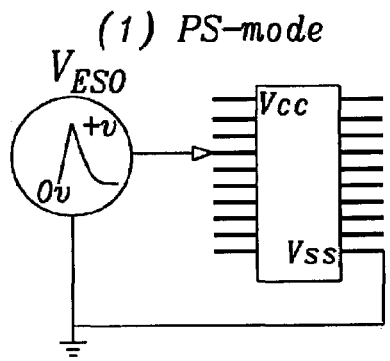
FIG. 2A
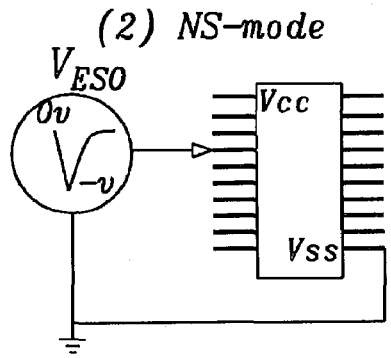
FIG. 2B
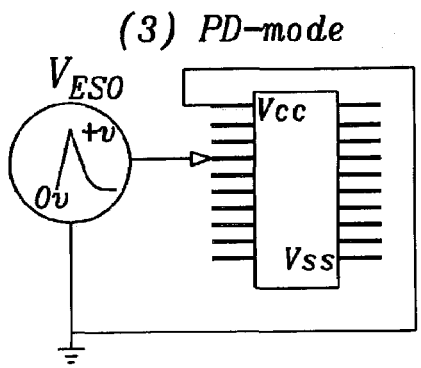
FIG. 2C
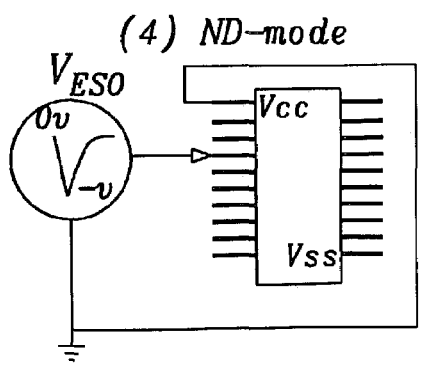
FIG. 2D

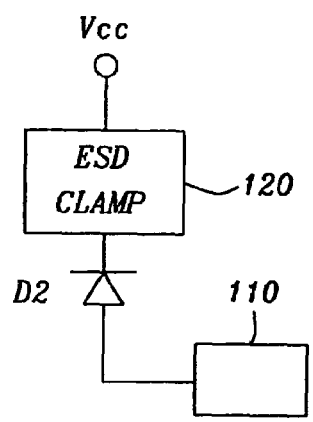 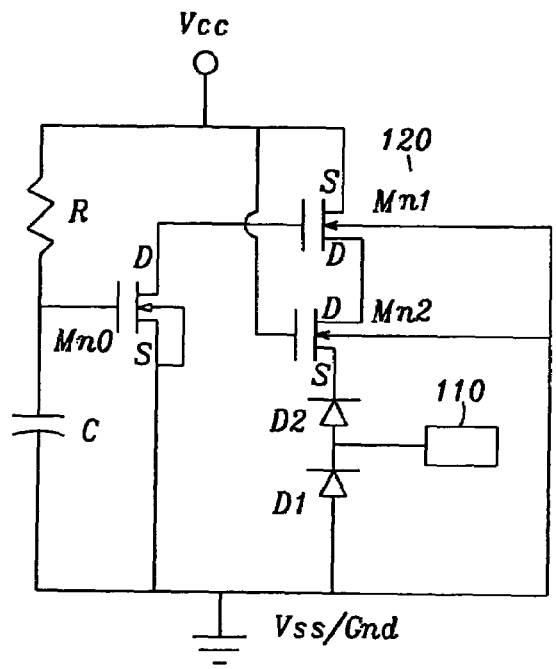
FIG. 4A          FIG. 4B
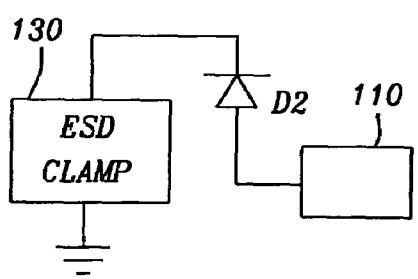 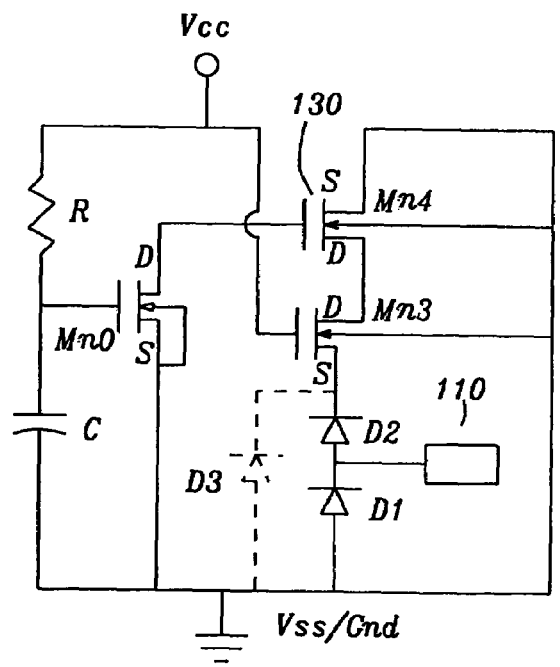
FIG. 5A          FIG. 5B 60 — Creating first, second, third, and forth NMOS devices, a first second and third diode device, a trigger enhancing NMOS device, and a resistor and capacitor device on a semiconductor substrate. The third diode element is created from the parasitic elements of the third NMOS source to substrate junction.

62 — Connecting the anode of the second diode to the cathode of the first diode and to an I/O pad, connecting the cathodes of the second and third diodes to the source of the first and third NMOS, and connecting the anode of the first and third diode to a second voltage source, Vss, typical ground.

64 — Connecting the source of the trigger enhancing NMOS, as well as the substrate electrical contact to the second voltage source, Vss or ground, and gate to the first ends of the resistor and capacitor.

66 — Connecting the first side of the resistor to the first side of the capacitor and to the gate of the trigger enhancing NMOS, Connecting the second side of the resistor to the first voltage source, Vcc, and the second side of the capacitor to the second voltage source, Vss or ground.

68 — Connecting the drain of the first NMOS to the drain of the second NMOS, the gate of the first NMOS nad source of the second NMOS to a first voltage source, Vcc, and the gate of the second NMOS to the drain of the trigger enhancing NMOS.

70 — Connecting the gate of the third NMOS device to a first voltage source, Vcc, and the drain to the drain of the forth NMOS device. Connecting the source of the forth NMOS device to the second voltage source, and connecting the gate of the forth NMOS device to the gate of the trigger enhancing NMOS.

FIG. 7

HIGH VOLTAGE TOLERANT ESD DESIGN FOR ANALOG AND RF APPLICATIONS IN DEEP SUBMICRON CMOS TECHNOLOGIES

FIELD OF THE INVENTION

The present invention relates generally to the structure and process for an ESD protection arrangement for high voltage tolerant ESD protection for analog applications requiring low capacitance such as radio frequency and high speed analog transceivers.

DESCRIPTION OF PRIOR ART

Because of high input impedance and thin oxide gate structures, the problem of electrostatic discharge damage (ESD) with field effect transistor (FET) devices can be severe. Therefore the input/output (I/O) circuit locations or pins usually have a protective device connected between the I/O pin and the internal circuits which allows the ESD current to be shunted to an alternative voltage source, typically ground, protecting the active internal circuits from damage.

There can be several different types of device structures used for these protective devices, such as single diodes, stacked diodes, field effect transistor devices, and silicon controlled rectifiers (SCR).

With prior art devices, the capacitance associated with the ESD protection device on the active circuit input pin can be a concern as circuit speeds increase. A typical prior art protection circuit scheme is represented in FIG. 1. The active circuit input-output (110) terminal or pin 10 is connected to a current limiting resistor R and then to the secondary ESD clamp or protection circuit device NMOS Mn12. A complimentary MOS (CMOS) inverter buffer 14 with Mp and Mn precede the input to the internal active logic circuits 16.

The secondary ESD clamp 12, is typically a gate-grounded short channel NMOS shown in FIG. 1 as Mn12. This clamps the ESD overstress voltage represented by the generator element 20 to a safe voltage for the internal circuits 16. To provide a high ESD protection level, a robust device such as a SCR, field thick-oxide device, or long channel NMOS is used as the primary ESD clamp 18 to bypass ESD current Iesd to a secondary voltage source, Vss or ground.

The primary clamp element 18 must be triggered on before the secondary clamping device 12 is damaged by the overstress Iesd current. The resistor R is required to limit the ESD current flowing in the secondary clamp 12. This resistor can be in the order of thousands of ohms.

The large junction capacitance of the clamp devices connected in an electrical parallel configuration together with the resistor R can cause a long RC delay. For current mode input signal applications, high frequency applications and analog applications this RC input loading cannot be tolerated. For this application a configuration is required that minimizes the input capacitance and eliminates the series resistor R.

The invention provides a unique structure and method, which minimizes the capacitance on the I/O pin while still providing appropriate high voltage tolerant (HVT) ESD protection without the need for current limiting resistance.

The following patents and reports pertain to ESD protection.

U.S. Pat. No. 6,606,752 (Williams) shows an ESD circuit for RF and analog applications.

U.S. Pat. No. 6,284,616B1 (Smith) Discusses an ESD circuit with a high voltage tolerance.

U.S. Pat. No. 5,477,414 (Li et al.) shows an ESD protection circuit.

U.S. Pat. No. 6,008,970 (Maloney et al.) reveals a power supply clamp circuit for ESD protection.

The following technical reports discuss ESD protection methods.

Richier et al., "Investigation on Different ESD Protection Strategies Devoted to 3.3 V RF Applications (2 Ghz) in a 0.18 um CMOS Process." EOS/ESD Symposium 2000, PP 252 to 259.

Paul Leroux, et al., "A 0.8 dB NF ESD Protected 9 Mw CMOS LNA". Proceedings of the 2001 ISSC PP 410 to 411.

Ming-Dou Ker, et al., "ESD Protection Design on Analog Pin with Very Low Input Capacitance for High Frequency or Current-Mode Applications" IEEE Journal of Solid-State Circuits, Volume 35; Issue 8; August 2000, PP 1194 to 1199.

Ming-Dou Ker, et al, "Dynamic-Floating-Gate Design for Output ESD Protection in a 0.35 um CMOS cell library", Proceedings of the 1998 ISCAS Volume 2; 1998, PP 216 to 219.

SUMMARY OF THE INVENTION

Accordingly, it is the primary objective of the invention to provide an effective structure and manufacturable method for providing an effective ESD clamping protection element while at the same time reducing the capacitive loading on the I/O circuits.

It is a further objective of the invention to improve ESD protection for high frequency and analog applications by providing a low input capacitance structure that will have minimum impact on device performance while maintaining robust ESD protection levels.

A still additional objective of the invention is to provide the ESD protection with reduced capacitance without changing the characteristics of the internal circuits being protected and by using a process compatible with the process of integrated MOS device manufacturing.

The above objectives are achieved in accordance with the methods of the invention that describes a structure and a manufacturing process for semiconductor ESD protection devices with reduced input capacitance.

One embodiment of the invention utilizes two NMOS series devices as a ESD energy clamp from I/O pin to Vcc, shielded from the I/O pin by a diode. The source of the second or top NMOS comprising the clamp is connected to Vcc while its gate is connected to the drain of an ESD trigger enhancing NMOS. The gate of the trigger enhancing NMOS is connected to the midpoint of an RC string between Vcc and ground. The drain of the second series NMOS is connected to the drain of the first series NMOS whose gate is connected to Vcc and whose source is connected to the cathode of the top or second diode of a series diode string.

The second diode anode is connected to the cathode of the first or bottom diode in the string and also connected to the I/O pin. The configuration protects against ESD charge flow from pin to Vcc. The relatively small second diode capacitance is stacked in series with the larger capacitance of the NMOS pair which provides an effective reduced capacitance from pin to Vcc of approximately the junction capacitance of the diode.

Another embodiment of the invention utilizes two series NMOS devices as a ESD clamp from I/O pin to Vss or ground. The clamp is shielded from the input pin by a series diode and with the source of the top or second NMOS connected to ground. This embodiment protects against any ESD charge from pin to ground. Because of the parasitic junction diode between the first NMOS source and substrate, the capacitance between pin and ground is essentially that of the two small diodes in parallel, which is smaller than that of the NMOS pair.

Yet another embodiment of the invention incorporates both the series NMOS device clamp to Vcc and the series NMOS device clamp to Vss or ground. Both pairs of devices are shielded from the I/O pin by a diode to reduce the capacitance seen by the I/O pin. This embodiment protects against ESD charge energy both from pin to Vcc and from pin to ground.

All embodiments utilize a a trigger enhancing NMOS whose gate is dynamically coupled to the ESD energy and to a RC circuit. The source of the trigger enhancing NMOS is typically connected to a gate of an NMOS in the clamp circuits to control the conduction duration.

BRIEF DESCRIPTION OF THE DRAWINGS

FIG. 1 shows a schematic representation of a prior art ESD protection scheme.

FIGS. 2A through 2D shows the configurations for ESD testing on Analog Input/Output Pins. FIGS. 2A and 2C illustrates the test case of positive voltage to Vss/Gnd. (PS Mode), FIGS. 2B and 2D is negative voltage to Vss/Gnd. (NS Mode).

FIG. 4A shows a simplified schematic of one embodiment of the invention for ESD protection for I/O Pin to Vcc while FIG. 4B shows the detailed schematic.

FIG. 5A shows a simplified schematic of one embodiment of the invention for ESD protection for I/O Pin to Vss or ground while FIG. 5B shows the detailed schematic. ESD protection for Pin to Vss Or ground.

FIG. 7 is a flow chart of the process of forming the protection devices for ESD protection from I/O pin to Vcc and I/O pin to Vss or ground.

DESCRIPTION OF THE PREFERRED EMBODIMENTS

Figure 3A:
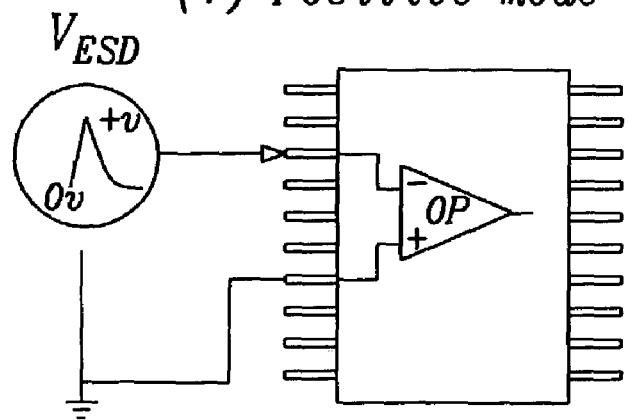
FIG. 3A shows the test configuration for "Positive Mode" differential ESD voltage and FIG. 3B shows the test configuration for "Negative Mode" ESD differential voltage.
Figure 3B:
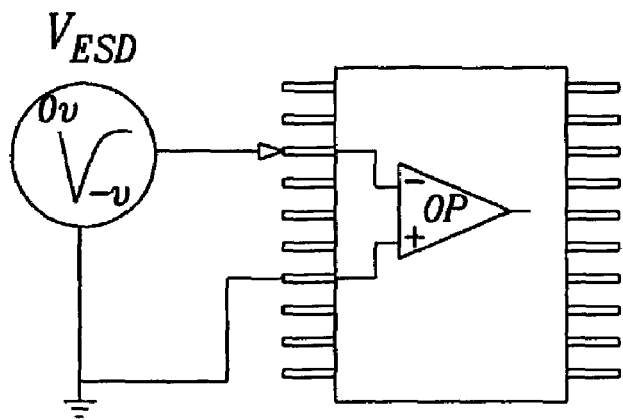

FIG. 4A shows a simplified schematic of the invention embodiment for ESD protection from I/O pin to Vcc. The ESD energy is clamped to Vcc by the NMOS string 120. Since capacitance elements in series add like resistors in parallel, the diode D2 shields the NMOS ESD clamp string 120 capacitance from the I/O pin 110 and internal active circuits. The capacitance of the diode is much less than the capacitance of the NMOS series string ESD clamp 120, and therefore the capacitance seen by the I/O pin 110 is essentially the relatively small capacitance of the diode D2.

The detailed schematic is shown in FIG. 4B. The cathode of the first diode D1 is connected to the I/O pin 10 while the anode is connected to a second voltage source, Vss, typically ground.

Diode D1 provides a shunt path for negative ESD energy to ground.

The cathode of the second diode D2 is connected to the source of NMOS Mn1 while the anode of D2 is connected to the I/O pin 110 and the cathode of diode D1. Diode D2 shields the I/O pin 110 from the relatively large capacitance of the series NMOS ESD clamp string 120. The gate of Mn1 is tied to a first voltage source Vcc while the drain is connected to the drain of Mn2. The gate of Mn2 is connected to the drain of a trigger enhancing NMOS Mn0 while the source of Mn2 is connected to Vcc.

The source of the trigger enhancing NMOS Mn0 is connected to the second voltage source, Vss, typically ground, as is the channel substrate for all the NMOS devices. The gate of Mn0 is connected to the first end of a resistor R whose second end is connected to a first voltage source, Vcc. The first end of resistor R and the gate of Mn0 are also connected to the first end of a capacitor whose other end is connected to a second voltage source, Vss or ground.

When a positive ESD event takes place at the I/O pin 110 with respect to Vcc, the energy is transferred through diode D2 and through the parasitic drain to gate capacitance of Mn1 turning it on. The energy then appears on Vcc which enables Mn0 to turn on after a time delay determined by the RC time constant. This grounds the gate of Mn2 after a suitable delay turning it off to complete the discharge cycle.

FIG. 5A is a simplified schematic of the embodiment of the invention clamping ESD energy to the second voltage source, Vss, or ground by means of the ESD clamping element 130. The clamp is again shielded from the input pin by diode D2.

FIG. 5B illustrates the schematic details of this embodiment of the invention. The I/O pin 110 is connected to the anode of D2 and cathode of D1 with the anode of D1 connected to a second voltage source, Vss, typically ground. The cathode of diode D2 is connected to the source of NMOS Mn3. The gate of Mn3 is connected to the first voltage source, Vcc, and the drain to the drain of the NMOS Mn4. The gate of Mn4 is connected to the drain of NMOS Mn0 and the source is connected to the second voltage source, or ground.

The source of Mn0 is connected to the second voltage source, Vss or ground, while the gate is again connected to the first end of a resistor R and the first end of a capacitor C. The second end of the resistor R is connected to the first voltage source, Vcc, and the second end of the capacitor is connected to the second voltage source Vss, typically ground.

Since the device substrate is grounded, the parasitic Mn3 source to substrate diode D3 is noticed effectively in electrical parallel with diodes D1 and D2 as shown in FIG. 5B. The combined diode effect on I/O pin loading is still substantially lower than for the ESD clamp 130 if it were unshielded.

The circuit turn on is similar to that described above, but with the ESD energy being shunted to Vss or ground through Mn3 and Mn4 until Mn4 is turned off by the dynamic gate action of Mn0.

Figure 6A:
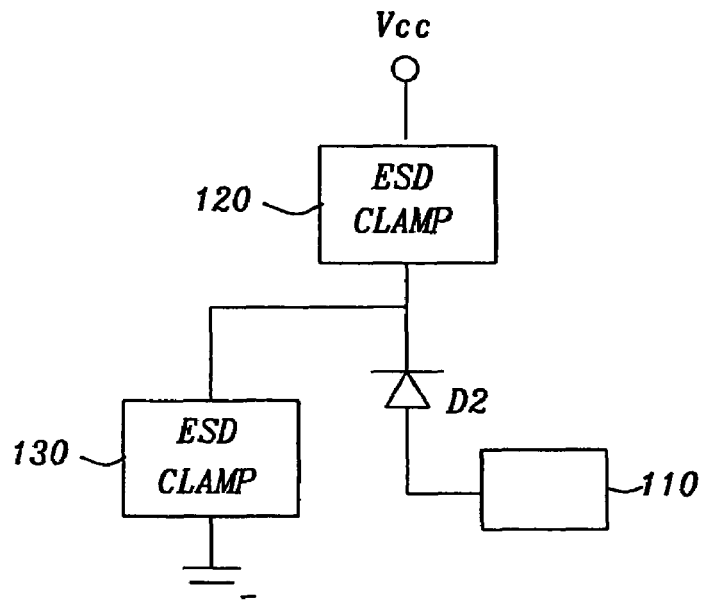
FIG. 6A shows a simplified schematic of one embodiment of the invention for ESD protection for I/O Pin to Vcc and I/O pin protection to Vss or ground.
Figure 6B:
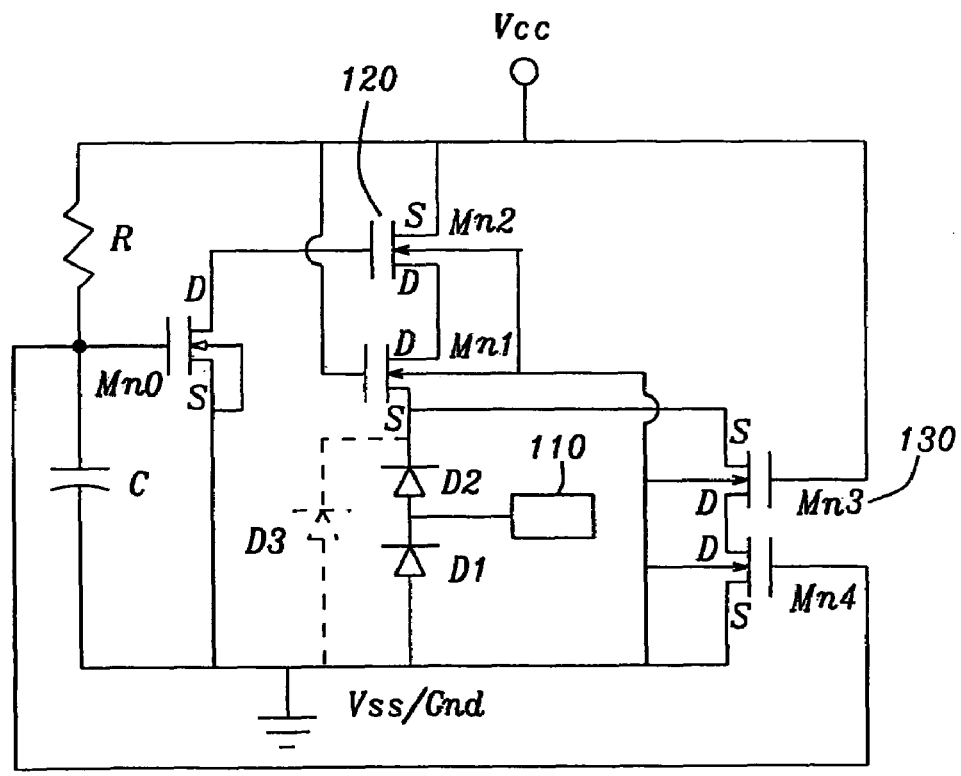
FIG. 6B shows the detailed schematic.

Another embodiment of the invention is shown in FIGS. 6A and 6B. FIG. 6A shows the ESD clamp 120 to the first voltage source, Vcc, and the ESD clamp 130 to the second voltage source or ground. This embodiment incorporates the protection elements of ESD energy from I/O pin 110 to Vcc and from the I/O pin 110 to the second voltage source, Vss or ground. Both ESD clamps are shielded from the I/O pin 110 by diode D2 which essentially reduces the capacitance seen at the I/O pin 110.

The schematic details are shown in FIG. 6B. This embodiment has the anode of D2 connected to the I/O pin 110 and to the cathode of diode D1. The anode of diode D1 is connected to a second voltage source, Vss, typically ground.

The cathode of diode D2 is connected to the source of NMOS Mn1 and the source of NMOS Mn3.

Since the device substrate is tied to the second voltage source, Vss or ground, the parasitic junction diode D3 of the source to substrate junction of NMOS Mn3 is essentially in parallel with diodes D1 and D2. The cathode of parasitic diode D3 is essentially connected to the cathode of D2, and the anode of D3 is essentially connected to the second voltage source or ground.

The drain of NMOS Mn1 is connected to the drain of NMOS Mn2, the second NMOS in the series string of the ESD clamp 120. The gate of Mn1 is tied to the first voltage source Vcc, as is the drain of Mn2, and the gate of NMOS Mn2 is tied to the drain of NMOS Mn0. The gate of NMOS Mn0 is tied to the junction of R and C elements with the second side of the resistor R tied to Vcc and the second side of the capacitor C is tied to the second voltage source Vss or ground.

The ESD clamp 130 consists of an NMOS series string Mn3 and Mn4. As previously mentioned, the source of Mn3 is connected to the cathode of diode D2 and the source of NMOS Mn1. The gate of Mn3 is tied to the first voltage source, Vcc, and the drain of Mn3 is connected to the drain of NMOS Mn4. The source of Mn4 is connected to the second voltage source, Vss or ground. The gate of NMOS Mn4 is connected to the gate of NMOS Mn0.

The process for creating the embodiment of the invention with clamps to both the first voltage source, Vcc, and to the second voltage source, Vss or ground, is illustrated in FIG. 7.

Element 60 of the process flow chart of FIG. 7 illustrates the initiation of the process by creating on a semiconductor substrate the first series pair Mn1 and Mn2 and the second series pair Mn3 and Mn4. It also describes the creation of diodes D1, D2, and D3. The diode D3 is created from the parasitic elements of the third NMOS, Mn3, source to substrate junction. FIG. 7 element 60 also describes the creation of the resistor R and capacitor C components of the RC network, and the trigger enhancing NMOS device Mn0, on the same substrate.

Continuing with element 62 of FIG. 7, the diode network is formed by connecting the anode of the second diode D2 to the cathode of the first diode D1 and to the semiconductor I/O circuit 110. The cathodes of the second and third diodes are connected together and to the source elements of the first and third NMOS elements, Mn1 and Mn3. The process continues by connecting the anodes of the first and third diodes to a second voltage source, Vss, typically ground.

Element 64 describes the connection of the source of the special trigger enhancing NMOS Mn0 as well as the substrate to a second voltage source, Vss or ground, and the gate of Mn0 to the first ends of the resistor and capacitor.

The process continues by connecting the first side of the resistor R to the first side of the capacitor C as well as to the gate of the trigger enhancing NMOS Mn0 as indicated in FIG. 7 element 66. The second side of the resistor R is connected to a first voltage source Vcc and connecting the second side of the capacitor C to a second voltage source Vss or ground completes the RC circuit.

Element 68 describes the connecting of the drain of NMOS Mn1 to the drain of the second NMOS, Mn2, and the gate of Mn1 and source of Mn2 to a first voltage source, Vcc. The gate of NMOS Mn2 is connected to the source trigger enhancing NMOS Mn0.

FIG. 7 element 70 illustrates the formation of the second ESD clamp element 130 by connecting the gate of the third NMOS Mn3 to a first voltage source, Vcc, connecting the drain of the third NMOS Mn3 to the drain of the fourth NMOS Mn4, connecting the source of the fourth NMOS device Mn4 to the second voltage source, Vss, typically ground, and connecting the gate of NMOS Mn4 to the gate of the trigger enhancing NMOS Mn0.

The test results of the high voltage capability device are shown in table 1 which compares the normal protection device to the invention device. The test conditions are shown in schematic form in FIGS. 2A through 2C and FIGS. 3A and 3B.

As can be seen from table 1, the invention device affords the same degree of protection from ESD as indicated by the machine model (MM) and human body model (HBM) test results. The invention provides the additional advantage of shielding the relatively high capacitance of the clamp circuits from the I/O circuits. This enables the invention to be beneficial in applications requiring reduced capacitance such as radio frequency applications and analog transceivers.

TABLE 1

Table 1: Measured Body Model (HBM) and Machine Model (MM) protection for Traditional Analog Pin versus Invention High Voltage Tolerance (HVT) Analog Pin

|  | PS Mode | NS Mode | PD Mode | ND Mode | Positive Pin to Pin Mode | Negative Pin to Pin Mode |
|---|---|---|---|---|---|---|
| Non-HVT pin HBM | 7 KV | 6 KV | 7 KV | 6 KV | 7 KV | 6 KV |
| HVT pin HBM | 6.5 KV | 6 KV | 7 KV | 7 KV | 7.5 KV | 6 KV |
| Non-HVT pin MM | 600 V | 550 V | 600 V | 500 V | 600 V | 550 V |
| HVT pin MM | 550 V | 550 V | 600 V | 650 V | 650 V | 550 V |

While the invention has been particularly shown and described with reference to the preferred embodiments thereof, it will be understood by those skilled in the art that various changes in form and details may be made without departing from the spirit and scope of the invention.

The invention claimed is:

1. A low capacitance semiconductor I/O ESD protection structure on a substrate comprising:
   a first and second NMOS on said substrate;
   a first and second diode on said substrate connecting to said semiconductor I/O;
   a trigger enhancing NMOS on said substrate connecting to said second NMOS; and a resistor and capacitor element on said substrate connecting with said trigger enhancing NMOS.

2. The protection structure of claim 1 wherein said second diode cathode is connected to the source of said first NMOS and said second diode anode is connected to said first diode cathode and to said semiconductor I/O pin.

3. The protection structure of claim 1 wherein said first diode anode and said substrate are connected to a second voltage source.

4. The protection structure of claim 1 wherein said first NMOS drain is connected to said second NMOS drain, and said first NMOS gate and said second NMOS source are connected to a first voltage source.

5. The protection structure of claim 1 wherein said second NMOS gate is connected to said trigger enhancing NMOS drain.

6. The protection structure of claim 1 wherein said trigger enhancing NMOS source is connected to a second voltage source and said NMOS gate is connected to the first end of said resistor and the first end of said capacitor.

7. The protection structure of claim 1 wherein the second end of said resistor is connected to the first voltage source.

8. The protection structure of claim 1 wherein the second end of said capacitor is connected to the second voltage source.

9. The protection structure of claim 1 wherein said first and said second NMOS devices form an ESD energy clamp between said semiconductor I/O and a first voltage source.

10. The protection structure of claim 1 wherein said second diode shields said I/O pin from said capacitance of said ESD energy clamp thereby presenting a lower capacitance to said I/O pin.

11. A low capacitance semiconductor I/O ESD protection structure on a substrate comprising:
    a first and second NMOS on said substrate;
    a first and second diode on said substrate connecting to said semiconductor I/O, and a third diode connected to said second diode;
    a trigger enhancing NMOS on said substrate connecting to said second NMOS; and a resistor and capacitor element on said substrate connecting with said trigger enhancing NMOS.

12. The protection structure of claim 11 wherein said second diode cathode is connected to the source of said first NMOS and to the cathode of said third diode, and said second diode anode is connected to said first diode cathode and to said semiconductor I/O.

13. The protection structure of claim 11 wherein said first and said third diode anodes and said substrate and said second NMOS source are connected to said second voltage source.

14. The protection structure of claim 11 wherein said first NMOS gate is connected to a first voltage source and said first and said second NMOS drains are connected together.

15. The protection structure of claim 11 wherein said second NMOS gate is connected to said trigger enhancing NMOS drain.

16. The protection structure of claim 11 wherein said trigger enhancing NMOS source is connected to said second voltage source and said NMOS gate is connected to the first end of said resistor and the first end of said capacitor.

17. The protection structure of claim 14 wherein the second end of said resistor is connected to said first voltage source.

18. The protection structure of claim 11 wherein the second end of said capacitor is connected to aid second voltage source.

19. The protection structure of claim 11 wherein said first and said second NMOS devices form an ESD energy clamp between said semiconductor I/O and said second voltage source.

20. The protection structure of claim 11 wherein said second diode shields said semiconductor I/O from said capacitance of said ESD energy clamp thereby presenting a lower capacitance to said semiconductor I/O.

21. A low capacitance semiconductor I/O ESD protection structure on a substrate comprising:
    a first, second, third and fourth NMOS device on said substrate;
    a first and a second diode device connected to said semiconductor I/O, and a third diode connected between said second diode and a second voltage source;
    a trigger enhancing NMOS device on said substrate connecting to said second and fourth NMOS device; and
    a resistor and capacitor element on said substrate connected with said trigger enhancing NMOS device.

22. The protection structure of claim 21 wherein said second diode cathode is connected to the source of said first and said third NMOS and to the cathode of said third diode and said second diode anode is connected to said first diode cathode and to said semiconductor I/O.

23. The protection structure of claim 21 wherein said first and said third diode anodes and said substrate and said fourth NMOS source are connected to said second voltage source.

24. The protection structure of claim 21 wherein said first NMOS gate and said second NMOS source and said third NMOS gate are connected to a first voltage source and said first and said second NMOS drains are connected together.

25. The protection structure of claim 21 wherein said second NMOS gate is connected to said trigger enhancing NMOS drain.

26. The protection structure of claim 21 wherein said trigger enhancing NMOS source is connected to said second voltage source and said NMOS gate is connected to the first end of said resistor and the first end of said capacitor.

27. The protection structure of claim 24 wherein the second end of said resistor is connected to said first voltage source.

28. The protection structure of claim 21 wherein the second end of said capacitor is connected to said second voltage source.

29. The protection structure of claim 21 wherein the drain of said third NMOS and the drain of said fourth NMOS are connected together.

30. The protection structure of claim 21 wherein the gate of said fourth NMOS is connected to the gate of said trigger enhancing NMOS.

31. The protection structure of claim 24 wherein said first and said second NMOS devices form an ESD energy clamp between said semiconductor I/O and said first voltage source and said third and said fourth NMOS form an ESD energy clamp between said semiconductor I/O and said second voltage source.

32. The protection structure of claim 21 wherein said second diode shields said I/O pin from said capacitance of said ESD energy clamp thereby presenting a lower capacitance to said I/O pin.

* * * * *